(12) United States Patent
Suh

(10) Patent No.: US 6,209,056 B1
(45) Date of Patent: *Mar. 27, 2001

(54) SEMICONDUCTOR MEMORY DEVICE HAVING A PLURALITY OF BANK SECTIONS DISTRIBUTED IN A PLURALITY OF DIVIDED MEMORY CELL ARRAYS

(75) Inventor: Jung Won Suh, Kyoungki-do (KR)

(73) Assignee: Hyundai Electronics Industries Co., Ltd., Ichon-shi (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/885,035

(22) Filed: Jun. 30, 1997

(30) Foreign Application Priority Data

Jun. 29, 1996 (KR) .................................. 96-25753

(51) Int. Cl.⁷ ............................. G06F 12/06; G11C 11/34
(52) U.S. Cl. ..................... 711/5; 711/173; 365/230.03; 365/230.06
(58) Field of Search ................. 711/5, 170, 173; 365/230.03, 230.06

(56) References Cited

U.S. PATENT DOCUMENTS

| | | | |
|---|---|---|---|
| 4,630,230 | * 12/1986 | Sundet | 711/169 |
| 4,635,233 | 1/1987 | Matsumoto et al. | 365/230.03 |
| 4,731,761 | 3/1988 | Kobayashi | 365/230.06 |
| 4,845,677 | * 7/1989 | Chappell et al. | 365/230.03 |
| 5,150,330 | * 9/1992 | Hag | 365/230.03 |
| 5,297,102 | * 3/1994 | Tanizaki | 365/230.03 |
| 5,327,389 | 7/1994 | Seok et al. | 365/230.03 |
| 5,369,619 | 11/1994 | Ohba | 365/230.03 |
| 5,463,590 | 10/1995 | Watanabe | 365/230.03 |
| 5,568,427 | 10/1996 | Takemae | 365/230.03 |
| 5,604,697 | * 2/1997 | Takahashi et al. | 365/230.03 |
| 5,712,827 | * 1/1998 | Ogihara et al. | 365/230.03 |
| 5,831,924 | * 11/1998 | Nitta et al. | 365/230.03 |

FOREIGN PATENT DOCUMENTS

| | | |
|---|---|---|
| 0 421 447 | 4/1991 | (EP) . |
| 2 259 383 | 3/1993 | (GB) . |
| 2 285 156 | 6/1995 | (GB) . |
| 4-159689 | 6/1992 | (JP) . |
| 4-362592 | 12/1992 | (JP) . |

* cited by examiner

Primary Examiner—Glenn Gossage
(74) Attorney, Agent, or Firm—Jacobson, Price, Holman & Stern, PLLC

(57) ABSTRACT

A semiconductor memory device has a plurality of memory cell arrays with a plurality of bank sections. Bank sections identified by different sequence numbers are operated independently of each other. A plurality of data bus lines transfer data in order to write into a desired bank section in each of the memory cell arrays and to read data from the desired bank section in each of the memory cell arrays. The desired bank sections with a same sequence number in each of memory cell arrays are selected simultaneously by a vertical and horizontal bank selection signal.

5 Claims, 6 Drawing Sheets

SEMICONDUCTOR MEMORY DEVICE HAVING A PLURALITY OF BANK SECTIONS DISTRIBUTED IN A PLURALITY OF DIVIDED MEMORY CELL ARRAYS

BACKGROUND OF THE INVENTION

1. Field of the Invention

The present invention relates in general to a method for distributing banks in a semiconductor memory device, in which individual cells are efficiently grouped into the banks, and more particularly to a bank distribution method for dividing each cell array vertically and horizontally into a plurality of banks and minimizing the length of a data bus to make a high-speed operation of the semiconductor memory device possible.

2. Description of the Prior Art

Generally, a group of cells individually accessed in a semiconductor memory device is called a bank. A very large scale integrated memory device requires a plurality of banks because the performance is enhanced by a bank-interleaved operation.

For example, a 16-Mbit (megabit) dynamic random access memory (DRAM) requires two banks, a 64-Mbit DRAM requires four banks, a 256-Mbit DRAM requires eight or sixteen banks, and a 1-Gbit (gigabit) DRAM requires thirty-two or more banks.

The distribution of banks is performed for the improvement in operation speed of a semiconductor memory device. This is due to the fact that the operation speed of the semiconductor memory device is much lower than that of a microprocessor, resulting in a degradation in the entire system performance. As a result, in order to meet high speed and high bandwidth requirements of the semiconductor memory device, a plurality of banks must be provided in the memory device. Such a conventional bank distribution method for the semiconductor memory device will hereinafter be described with reference to FIG. 1.

FIG. 1 is a view illustrating a distributed bank configuration of a conventional semiconductor memory device. As shown in this drawing, the conventional semiconductor memory device comprises a plurality of banks (for example, four banks 0–3), each of which is provided with two bank sections, or left and right bank sections, corresponding respectively to cell arrays. A column decoder is connected to each of the left and right bank sections, and a row decoder is positioned between the left and right bank sections and connected in common to them.

A data bus is provided with N (natural number) data bus lines for transferring data from the banks 0–3 to N input/output pads, respectively.

However, in the above-mentioned conventional semiconductor memory device, the length of the data bus is extremely long because it transfers data from all the banks 0–3 to the N input/output pads, resulting in a delay in data output. Such a data output delay makes a high-speed operation of the semiconductor memory device impossible.

Further, the bank implementation requires the same number of row decoders and row control signals as that of the banks, resulting in a significant increase in chip area.

SUMMARY OF THE INVENTION

Therefore, the present invention has been made in view of the above problems, and it is an object of the present invention to provide a method for distributing banks in a semiconductor memory device, in which each cell array is vertically and horizontally divided into a plurality of banks, resulting in a significant reduction in chip area as compared with a conventional bank distribution method. This method also allows a data bus to be minimized in length because it is localized to each cell array, so that high-speed operation of a semiconductor memory device is possible.

In accordance with one aspect of the present invention, there is provided a method for distributing banks in a semiconductor memory device, the banks being $2^{X+Y}$ in number, the semiconductor memory device having a $2^A$-bit capacity and including $2^{A-B-1}$ cell array blocks, each including two $2^B$-bit cell arrays, a plurality of column decoders connected respectively to the cell arrays, and a plurality of row decoders, each being positioned between the two cell arrays in each of the cell array blocks and connected in common to them, the method comprising a first step of dividing each of the $2^B$-bit cell arrays horizontally by $2^X$ and vertically by $2^Y$ into $2^{X+Y}$ cell groups in such a manner that $2^{B-X-Y}$ cells are allocated to each of the $2^{X+Y}$ cell groups; and a second step of defining each of the $2^{X+Y}$ cell groups as a bank section of a corresponding one of the $2^{X+Y}$ banks, where A, B, X and Y are natural numbers.

In accordance with another aspect of the present invention, there is provided a method for distributing banks in a semiconductor memory device, the banks being $2^{X+Y-P}$ in number, the semiconductor memory device having a $2^A$-bit capacity and including $2^{A-B-1}$ cell array blocks, each including two $2^B$-bit cell arrays, a plurality of column decoders connected respectively to the cell arrays, and a plurality of row decoders, each being positioned between the two cell arrays in each of the cell array blocks and connected in common to them, the method comprising a first step of dividing each of the $2^B$-bit cell arrays horizontally by $2^X$ and vertically by $2^Y$ into $2^{X+Y}$ cell groups in such a manner that $2^{B-X-Y}$ cells are allocated to each of the $2^{X+Y}$ cell groups; and a second step of defining every $2^P$ of the $2^{X+Y}$ cell groups as bank sections of a corresponding one of the $2^{X+Y-P}$ banks, where A, B, P, X and Y are natural numbers.

In accordance with still another aspect of the present invention, there is provided a method for distributing banks in a semiconductor memory device, the banks being $2^{X+Y+1}$ in number, the semiconductor memory device having a $2^A$-bit capacity and including $2^{A-B-1}$ cell array blocks, each including two $2^B$-bit cell arrays, a plurality of column decoders connected respectively to the cell arrays, and a plurality of row decoders, each being positioned between the two cell arrays in each of the cell array blocks and connected in common to them, the method comprising a first step of dividing each of the $2^B$-bit cell arrays horizontally by $2^X$ and vertically by $2^Y$ into $2^{X+Y}$ cell groups in such a manner that $2^{B-X-Y}$ cells are allocated to each of the $2^{X+Y}$ cell groups; and a second step of defining each of the $2^{X+Y+1}$ cell groups in each of the cell array blocks as a bank section of a corresponding one of the $2^{X+Y+1}$ banks, where A, B, X and Y are natural numbers.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
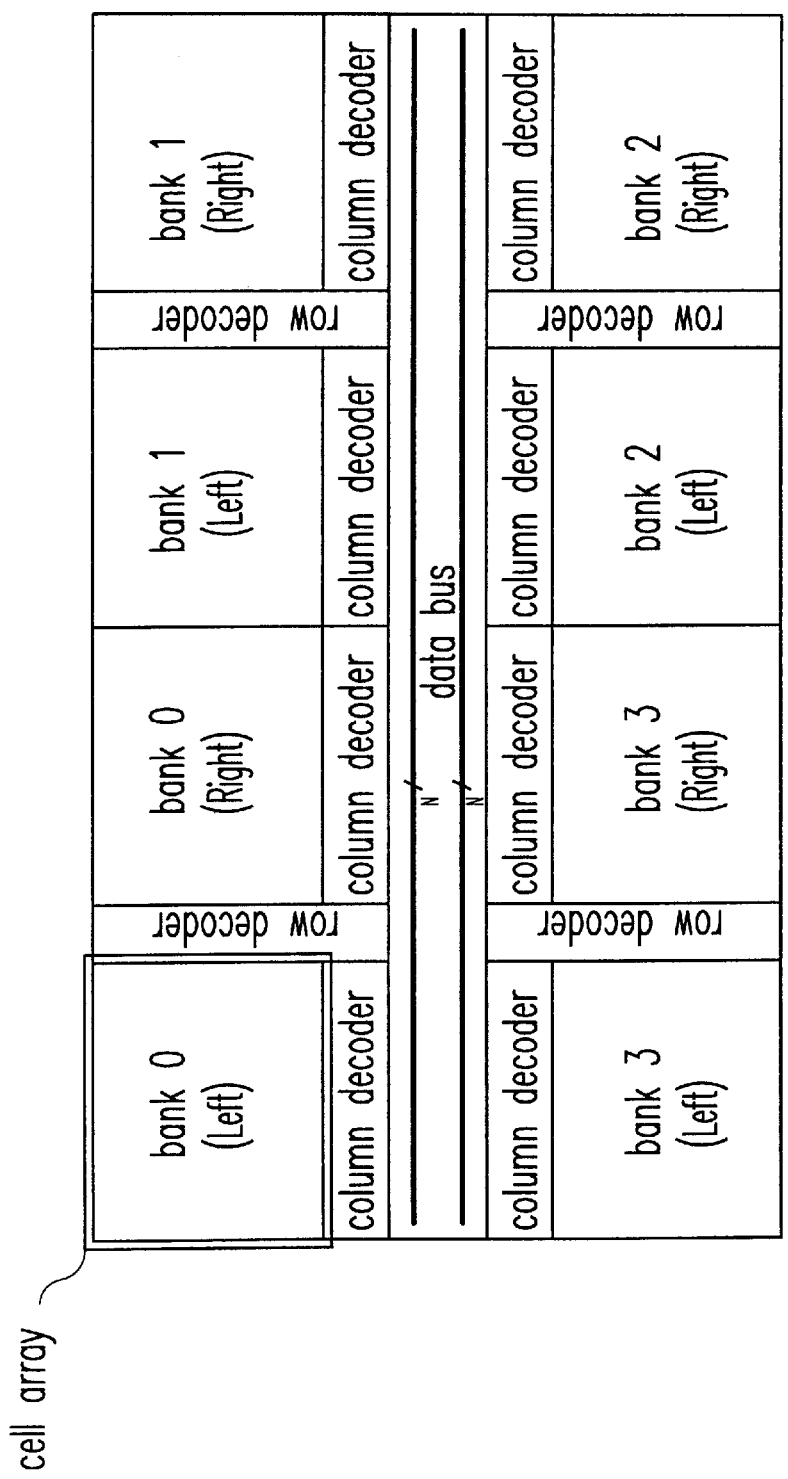
FIG. 1 is a view illustrating a distributed bank configuration of a conventional semiconductor memory device.
Figure 2:
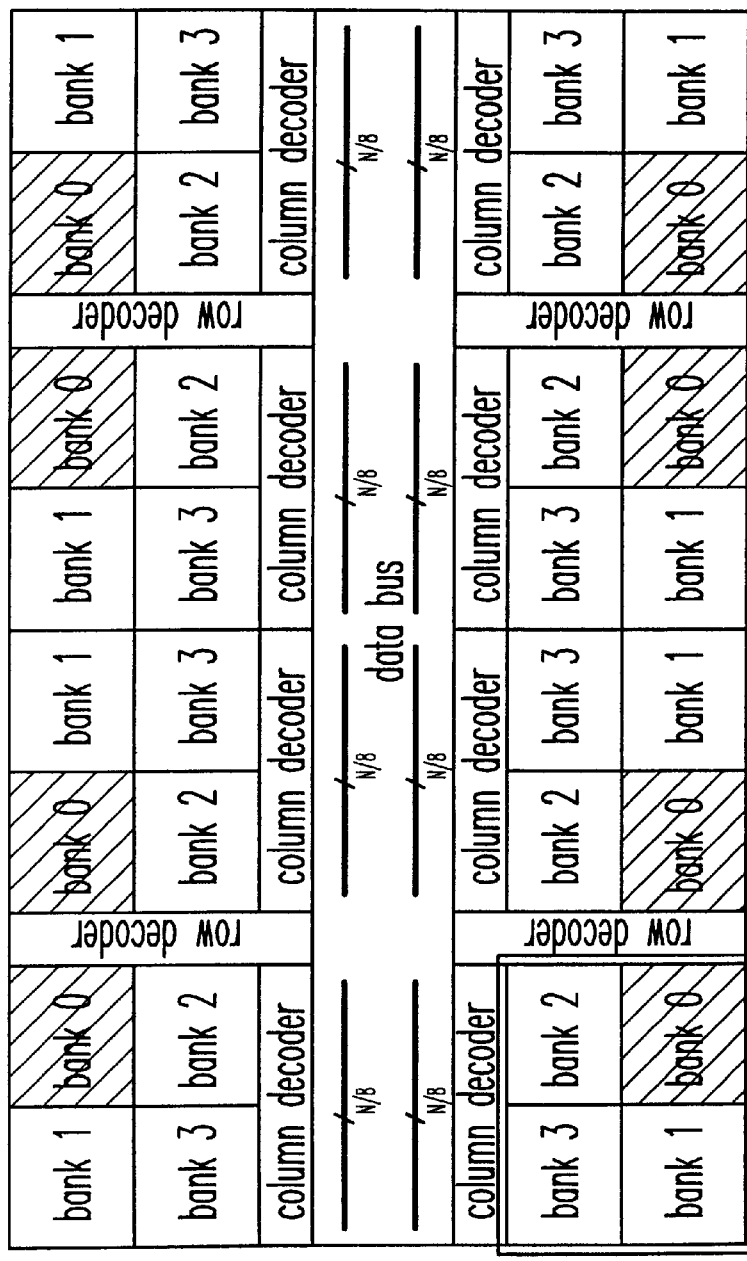
FIG. 2 is a view illustrating a distributed bank configuration of a semiconductor memory device in accordance with a first embodiment of the present invention.

FIG. 2 is a view illustrating a distributed bank configuration of a semiconductor memory device in accordance with a first embodiment of the present invention. As shown in this drawing, the semiconductor memory device comprises a plurality of cell array blocks (for example, four cell array blocks), each of which is provided with two cell arrays. Each of the cell arrays is divided vertically by 2 and horizontally by 2 into four groups of cells, each of which constitutes one bank section. A column decoder is connected to each of the cell arrays, and a row decoder is positioned between the two cell arrays in each of the cell array blocks and connected in common to them.

The semiconductor memory device also comprises a plurality of banks (for example, four banks 0–3), each of which is provided with eight bank sections corresponding respectively to the cell arrays. For example, the bank 0, indicated by the slash lines in the drawing, includes eight bank sections which are distributed respectively in all the cell arrays.

When any one of the four banks 0–3 is accessed, data from the eight bank sections of the corresponding bank are outputted at the same time, resulting in an increase in output speed.

A data bus is provided corresponding to each of the cell arrays and includes N/8 data bus lines. As a result, the data bus is minimized in length.

In the case where the semiconductor memory device has a $2^A$-bit capacity and includes $2^{A-B-1}$ cell array blocks, each including two $2^B$-bit cell arrays, a plurality of column decoders connected respectively to the cell arrays, and a plurality of row decoders, each being positioned between the two cell arrays in each of the cell array blocks and connected in common to them (where, A and B are natural numbers and $2^A$ signifies the number of cells in the memory device), each of the $2^B$-bit cell arrays is divided horizontally by $2^X$ and vertically by $2^Y$ into $2^{X+Y}$ cell groups, each including $2^{B-X-Y}$ cells, where X and Y are natural numbers. Then, each of the $2^{X+Y}$ cell groups is defined as a bank section of a corresponding one of $2^{X+Y}$ banks.

In other words, the semiconductor memory device comprises $2^{X+Y}$ banks, each of which has a $2^{A-X-Y}$-bit capacity. Each of the $2^{X+Y}$ banks includes $2^{B-X-Y}$-bit cell groups, or bank sections, distributed respectively in all the cell arrays.

For example, in a 16-Mbit DRAM, $2^A$ is $2^{24}$ and $2^B$ is $2^{21}$ when each cell array has a 16-Mbit capacity. In this case, the number of cell array blocks is $2^{24-21-1}$, or 4.

Also, in the case where N (natural number) data are to be simultaneously accessed from the $2^{B-X-Y}$-bit bank sections of one bank distributed respectively in all the cell arrays, $2^{A-B}$ data buses, each including an $n/2^{A-B}$-bit capacity, must be designed in the memory device to transfer the N data to input/output pads. Namely, all the data buses can transfer N bits to the data input/output pads at the same time.

Figure 3:
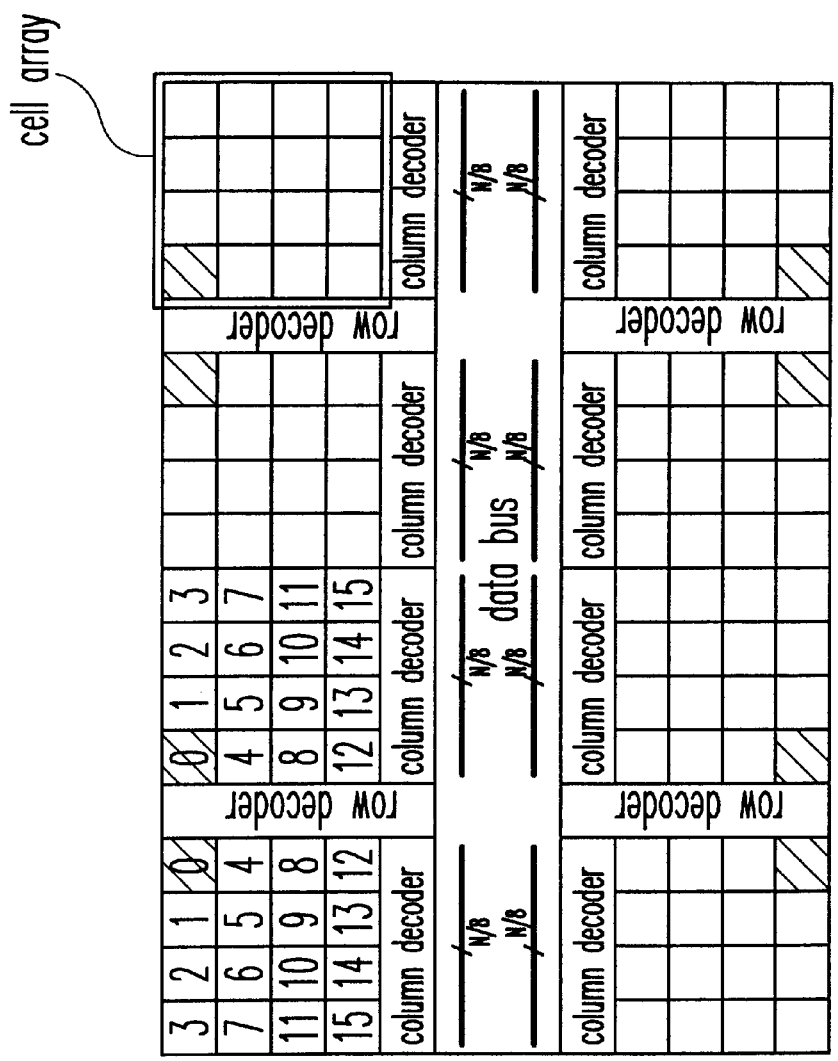
FIG. 3 is a view illustrating a distributed bank configuration of a semiconductor memory device in accordance with a second embodiment of the present invention.

FIG. 3 is a view illustrating a distributed bank configuration of a semiconductor memory device in accordance with a second embodiment of the present invention. As shown in this drawing, the second embodiment of the present invention is the same in construction as the first embodiment in FIG. 2, with the exception that each of the cell arrays is divided vertically by 4 and horizontally by 4 into sixteen groups of cells, each of which constitutes one bank section, and each of sixteen banks 0–15 is provided with eight bank sections corresponding respectively to the cell arrays. Similar to the first embodiment in FIG. 2, a data bus with an N/8-bit capacity is localized to each cell array.

The second embodiment in FIG. 3 can be expressed in the same algorithm as that of the first embodiment in FIG. 2.

Figure 4:
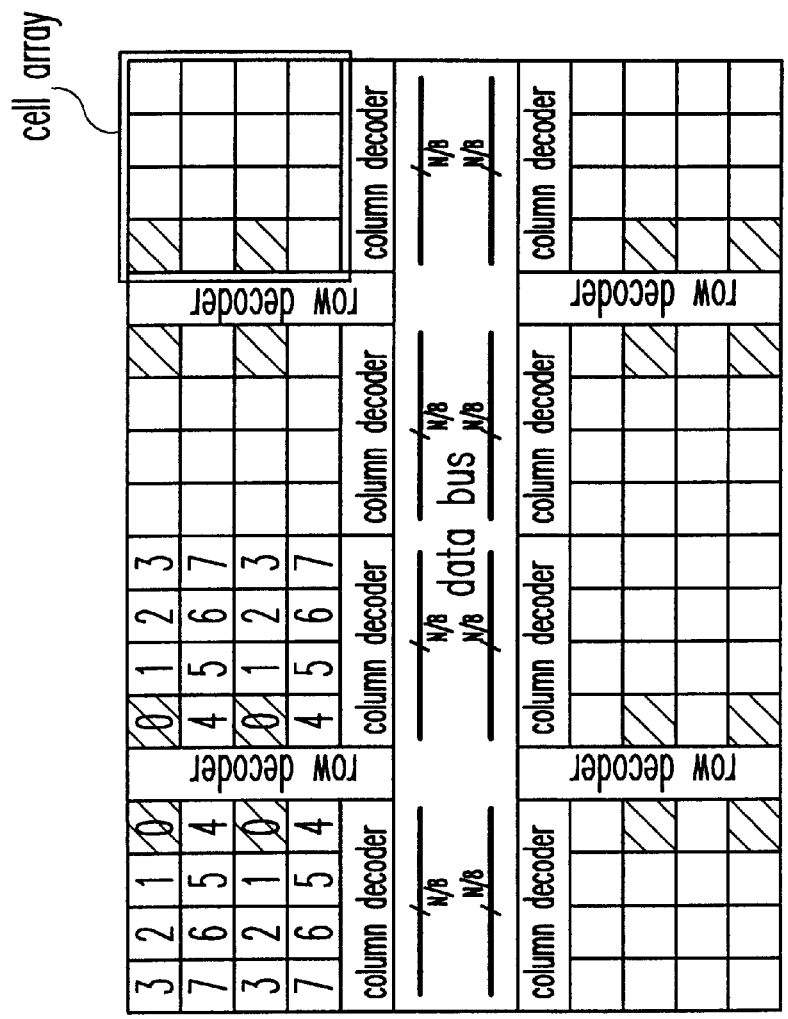
FIG. 4 is a view illustrating a distributed bank configuration of a semiconductor memory device in accordance with a third embodiment of the present invention.

FIG. 4 is a view illustrating a distributed bank configuration of a semiconductor memory device in accordance with a third embodiment of the present invention. As shown in this drawing, each of the cell arrays is divided vertically by 4 and horizontally by 4 into sixteen groups of cells, every two of which constitute two bank sections of one bank, and each of eight banks 0–7 is provided with sixteen bank sections, every two of which correspond to each of the cell arrays.

In the case where the semiconductor memory device has a $2^A$-bit capacity and includes $2^{A-B-1}$ cell array blocks, each including two $2^B$-bit cell arrays, a plurality of column decoders connected respectively to the cell arrays, and a plurality of row decoders, each being positioned between the two cell arrays in each of the cell array blocks and connected in common to them (where, A and B are natural numbers), each of the $2^B$-bit cell arrays is divided horizontally by $2^X$ and vertically by $2^Y$ into $2^{X+Y}$ cell groups, each including $2^{B-X-Y}$ cells, where X and Y are natural numbers. Then, every $2^P$ of the $2^{X+Y}$ cell groups are defined as bank sections of a corresponding one of $2^{X+Y-P}$ banks, where P is a natural number.

Similar to the first embodiment in FIG. 2, a data bus with an N/8-bit capacity is localized to each cell array.

Figure 5:
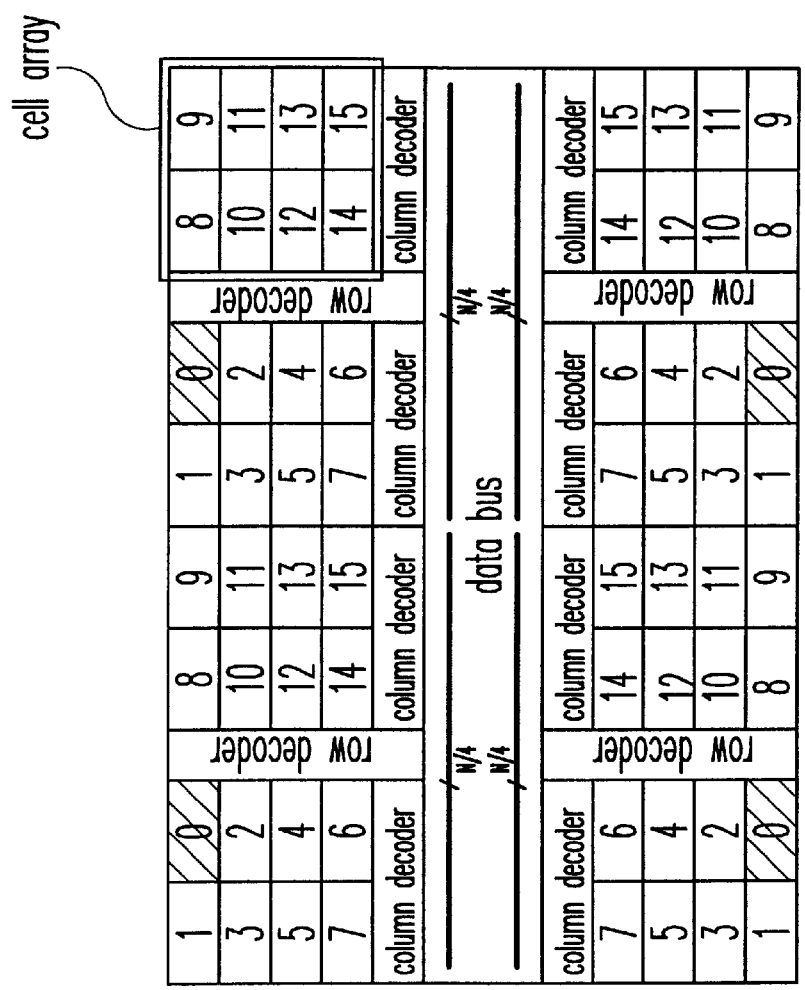
FIG. 5 is a view illustrating a distributed bank configuration of a semiconductor memory device in accordance with a fourth embodiment of the present invention.

FIG. 5 is a view illustrating a distributed bank configuration of a semiconductor memory device in accordance with a fourth embodiment of the present invention. As shown in this drawing, the semiconductor memory device comprises a plurality of cell array blocks (for example, four cell array blocks), each of which is provided with two cell arrays. Each of the cell arrays is divided vertically by 2 and horizontally by 4 into eight groups of cells, each of which constitutes one bank section. A column decoder is connected to each of the cell arrays, and a row decoder is positioned between the two cell arrays in each of the cell array blocks and connected in common to them.

The semiconductor memory device further comprises a plurality of banks (for example, sixteen banks 0–15), each of which is provided with four bank sections corresponding respectively to the cell array blocks.

In the case where the semiconductor memory device has a $2^A$-bit capacity and includes $2^{A-B-1}$ cell array blocks, each including two $2^B$-bit cell arrays, a plurality of column decoders connected respectively to the cell arrays, and a plurality of row decoders, each being positioned between the two cell arrays in each of the cell array blocks and connected in common to them (where, A and B are natural numbers), each of the $2^B$-bit cell arrays is divided horizontally by $2^X$ and vertically by $2^Y$ into $2^{X+Y}$ cell groups, each including $2^{B-X-Y}$ cells, where X and Y are natural numbers. Then, each of the $2^{X+Y+1}$ cell groups in each of the cell array blocks is defined as a bank section of a corresponding one of $2^{X+Y+1}$ banks.

In this manner, the plurality of banks are provided in the semiconductor memory device, so that the chip area can be increased minimally.

Also, in the case where N (natural number) data are to be simultaneously accessed from the $2^{B-X-Y}$-bit bank sections of one bank distributed respectively in all the cell array blocks, $2^{A-B-1}$ data buses, each including an $N/2^{A-B-1}$-bit capacity, must be designed in the memory device to transfer the N data to input/output pads. Namely, all the data buses can transfer N bits to the data input/output pads at the same time.

Figure 6A:
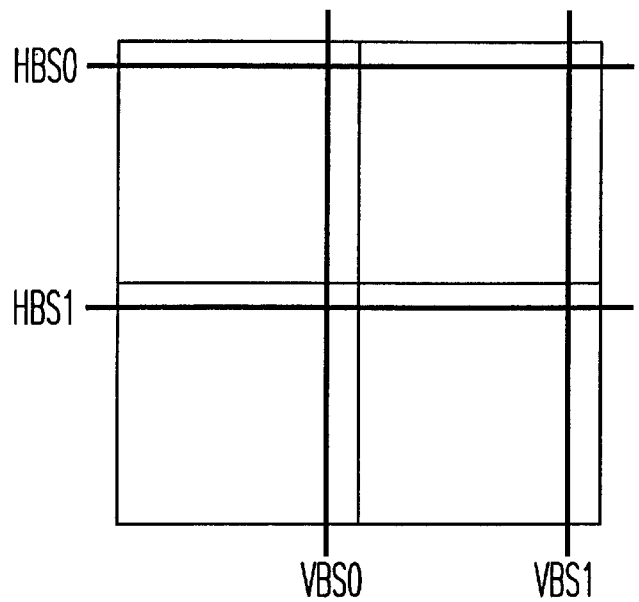
FIG. 6A is a view illustrating vertical and horizontal bank selection signals which are used in the present invention.
Figure 6B:
FIG. 6B is a circuit diagram illustrating the construction of a bank enable signal generator in accordance with the present invention.

FIG. 6A is a view illustrating vertical and horizontal bank selection signals VBS and HBS which are used in the present invention and FIG. 6B is a circuit diagram illustrating the construction of a bank enable signal generator in accordance with the present invention.

Word lines and bit line sense amplifiers in each bank must be driven independent of those in other banks. For this reason, a bank enable signal is necessary for each bank. In the case where each cell array is divided horizontally by $2^X$ and vertically by $2^Y$ into $2^{X+Y}$ bank sections, X+Y bank selection addresses (a part of row addresses) must be decoded to generate the horizontal and vertical bank selection signals HBS and VBS. In the bank enable signal generator, a NAND gate NANDs the horizontal and vertical bank selection signals HBS and VBS, and an inverter inverts an output signal from the NAND gate and outputs the inverted signal as the bank enable signal. Namely, the bank enable signal generator performs an AND operation with respect to the horizontal and vertical bank selection signals HBS and VBS to generate the bank enable signal.

The bank enable signal is used to make word line decoders and bit line sense amplifiers in the corresponding bank active, independently of those in other banks.

Although not shown, circuits for generating the horizontal and vertical bank selection signals HBS and VBS can be implemented simply by using a NAND gate and an inverter, as in a row decoder. In FIG. 6B, the horizontal and vertical bank selection signals HBS and VBS can be expressed as follows:

horizontal bank selection signal=HBSi, $1 \leq i \leq 2^X$ vertical bank selection signal=VBSj, $1 \leq j \leq 2^Y$.

As is apparent from the above description, according to the present invention, each of the cell arrays is vertically and horizontally divided into a plurality of banks, resulting in a significant reduction in chip area as compared with a conventional bank distribution method. Further, the data bus is minimized in length because it is localized to each cell array. Therefore, high-speed operation of a semiconductor memory device is possible.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:
   a plurality of memory cell arrays, each memory cell array including a plurality of bank sections that have respective sequence numbers, bank sections having different sequence numbers being accessed independently of each other;
   a plurality of data bus lines for transferring data in order to write data into a desired bank section in each memory cell array and to read data from a desired bank section in each memory cell array;
   wherein desired bank sections with a same sequence number in each of said plurality of memory cell arrays are selected simultaneously by a vertical and horizontal bank selection signal, the selected bank sections, which are distributed across said plurality of memory cell arrays, together forming a bank.

2. The semiconductor memory device according to claim 1, wherein each of the plurality of data bus lines has a same length.

3. A semiconductor memory device comprising:
   a plurality of memory cell arrays, each memory cell array including a plurality of bank sections that have respective sequence numbers, the sequence numbers of bank sections within one memory cell array corresponding to sequence numbers of bank sections within other memory cell arrays, such that bank sections having different sequence numbers are operated independently of each other while bank sections, distributed across the plurality of memory cell arrays, which share a common sequence number are selected simultaneously, bank sections which share a common sequence number forming a bank;
   a plurality of column decoders, each of said plurality of column decoders associated with a respective memory cell array;
   a plurality of row decoders, each of said plurality of row decoders vertically dividing two adjacent memory cell arrays;
   a plurality of data bus lines arranged in accordance with respective column decoders in order to transfer data to a desired bank section in each of said memory cell arrays and to read data from a desired bank section in each of said memory cell arrays;
   wherein a desired bank is selected according to a sequence number that corresponds with particular bank sections which are distributed across said plurality of memory cell arrays, said particular bank sections being thus selected simultaneously by a vertical and horizontal bank selection signal specifying the selected sequence number.

4. A semiconductor memory device having a plurality of memory cell arrays comprising:
   a plurality of banks, each bank including a predetermined number of bank sections distributed across the plurality of memory cell arrays, each memory cell array including a plurality of bank sections arranged in a matrix formed by dividing vertically and horizontally each memory cell array, each of said plurality of bank sections being identified by a sequence number, bank sections having different sequence numbers being operated independently of one another while bank sections which share a common sequence number are operated simultaneously with one another;
   a plurality of data bus lines for transferring data in order to write data into a desired bank section in each of said memory cell arrays and to read data from a desired bank section in each of said memory cell arrays;
   wherein the desired bank sections with a same sequence number in each of said memory cell arrays are selected simultaneously by a vertical and horizontal bank selection signal transmitted through said plurality of data bus lines, data from each of the selected bank sections being output simultaneously.

5. The semiconductor memory device as set forth in claim 4, wherein said plurality of data bus lines includes a data bus with an N/8-bit capacity localized to each memory cell array.

* * * * *